United States Patent
Tsai et al.

(10) Patent No.: US 6,561,204 B2
(45) Date of Patent: May 13, 2003

(54) APPARATUS AND METHOD FOR CLEANING WAFERS WITH CONTACT HOLES OR VIA HOLES

(75) Inventors: Lung Hui Tsai, Hsinchu (TW); Yu-Ling Huang, Chiai (TW); Hsin Yi Chang, Keelung (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 92 days.

(21) Appl. No.: 09/945,634

(22) Filed: Sep. 5, 2001

(65) Prior Publication Data

US 2003/0042225 A1 Mar. 6, 2003

(51) Int. Cl.$^7$ ................................................ B08B 3/02
(52) U.S. Cl. ...................... 134/144; 134/153; 134/902
(58) Field of Search ............................... 134/144, 153, 134/902

(56) References Cited

U.S. PATENT DOCUMENTS

| | | | |
|---|---|---|---|
| 5,168,886 A | * 12/1992 | Thompson et al. | 134/153 |
| 5,916,366 A | * 6/1999 | Ueyama et al. | 134/153 X |
| 6,453,916 B1 | * 9/2002 | Tran et al. | 134/144 X |
| 6,505,635 B1 | * 1/2003 | Vogtmann et al. | 134/153 X |

FOREIGN PATENT DOCUMENTS

| | | | | |
|---|---|---|---|---|
| JP | 231330 | * 11/1985 | | 134/902 |
| JP | 310923 | * 12/1990 | | 134/902 |
| JP | 14230 | * 1/1991 | | 134/902 |

* cited by examiner

Primary Examiner—Philip R. Coe
(74) Attorney, Agent, or Firm—Birch, Stewart, Kolasch & Birch, LLP

(57) ABSTRACT

An apparatus and a method for cleaning wafers with contact holes or via holes are provided. The apparatus for cleaning wafers comprises a first arm, a second arm, a fixing device, a rotating device and a spraying device. The fixing device, disposed on the first arm, fixes the wafer in a manner such that a surface of the wafer, with contact holes or via holes, faces downward. The rotating device, disposed above the fixing device, rotates the fixing device. The spraying device, disposed on the second arm in a manner such that the spraying device is located beneath the fixing device, sprays the water upwards to the surface of the wafer. By the apparatus and method according to the invention, the possibility of native oxide remaining in the contact holes or the via holes is greatly reduced. In addition, the removal of defects from the surface of the wafer is enhanced.

5 Claims, 4 Drawing Sheets

APPARATUS AND METHOD FOR CLEANING WAFERS WITH CONTACT HOLES OR VIA HOLES

BACKGROUND OF THE INVENTION

1. Field of the Invention

The invention relates to an apparatus and method for cleaning wafers with contact holes or via holes; in particular, the invention relates to a wafer-cleaning apparatus and method that disposes the wafer in a manner such that its surface, with contact holes or via holes, faces downward during cleaning.

2. Description of the Related Art

In ultra large scale integration (ULSI) process, for example, before wafers enter a high-temperature chamber or after being subjected to thin-film etching, the wafers must be subjected to chemical cleaning, de-ionized (DI) water rinsing and drying so the surface of the wafer can attain the requirement of high cleanliness. Wafer-cleaning technique affects the yield, the quality of the device and the reliability. Wafer cleaning removes contamination on the surface of the wafer, such as particles, organic and metal ions.

The wafer-cleaning technique comprises a wet chemical cleaning and a physical cleaning technology. No matter which procedure is used, a step in which DI water sprays or cleans the wafer is included.

In FIG. 1, a conventional wafer-cleaning apparatus, using DI water, is shown. Such apparatus comprises a vacuum chuck 22, a rotary shaft 24 and a sprayer 26. The vacuum chuck 22 fixes a wafer 10 by vacuum. The rotary shaft 24, disposed beneath the vacuum chuck 22 and connected with the vacuum chuck 22, rotates the vacuum chuck 22. The rotary shaft 24 rotates at high speed so that the wafer 10, disposed on the vacuum chuck 22, rotates at high speed. The sprayer 26, disposed above the vacuum chuck 22, sprays DI water downwards to the surface of the wafer 10, as shown by arrow A and arrow B.

In FIG. 2, a cross-section of the wafer 10 with via holes is shown. The wafer 10 is provided with a substrate 12, a metal layer 14 and a dielectric layer 16. The dielectric layer 16, for example, is oxide material. The via hole 30, defined by etching, is located inside the dielectric layer 16. When the wafer 10, as shown in FIG. 2, is disposed in a manner such that a surface S, with the via hole 30, of the wafer 10 faces upward, as shown in FIG. 1, the spraying DI water remains in the via hole 30 due to gravity. As a result, native oxide 40 is formed inside the via hole 30 so as to affect the characteristic of the device. In addition, because of gravity and the angle of the spraying water, defects, generated on the surface of the wafer, are splashed up by the water, easily fall back onto the surface of the wafer. Thus, the problem of defects remaining on the surface of the wafer often occurs.

SUMMARY OF THE INVENTION

In order to address the disadvantages of the aforementioned wafer-cleaning technique, the invention provides an apparatus and method for cleaning wafers with contact holes or via holes that can reduce the possibility of native oxide remaining in contact or via holes.

Another purpose of the invention is to provide an apparatus and method for cleaning wafers with contact holes or via holes that can enhance the removal of defects from the surface of the wafer.

Accordingly, the invention provides an apparatus for cleaning wafers with contact holes or via holes comprising a first arm, a second arm, a fixing device, a rotating device and a spraying device. The fixing device, disposed on the first arm, fixes the wafer in a manner such that a surface of the wafer, with contact holes or via holes, faces downward. The rotating device, disposed above the fixing device, rotates the fixing device. The spraying device, disposed on the second arm in a manner such that the spraying device is located beneath the fixing device, sprays the water upwards to the surface of the wafer.

Furthermore, the fixing device is a vacuum chuck, and the spraying device is a sprayer.

The spraying device comprises a nozzle. The apparatus further comprises an oscillator and a controller. The oscillator, disposed on the second arm, communicates with the nozzle. The controller electrically connects to the oscillator.

The invention provides a method for cleaning wafers with contact holes or via holes comprising the following steps. First, a substrate is provided, and at least one dielectric layer is formed on a surface of the substrate. Then, the dielectric layer is etched to form the contact holes or via holes, and the substrate is disposed in a manner such that its surface, with contact holes or via holes, faces downward. Finally, the water is applied upwards to the surface of the substrate.

Furthermore, the water is de-ionized water.

BRIEF DESCRIPTION OF THE DRAWINGS

The invention is hereinafter described in detail with reference to the accompanying drawings in which.

DETAILED DESCRIPTION OF THE INVENTION

First Embodiment

Figure 3:
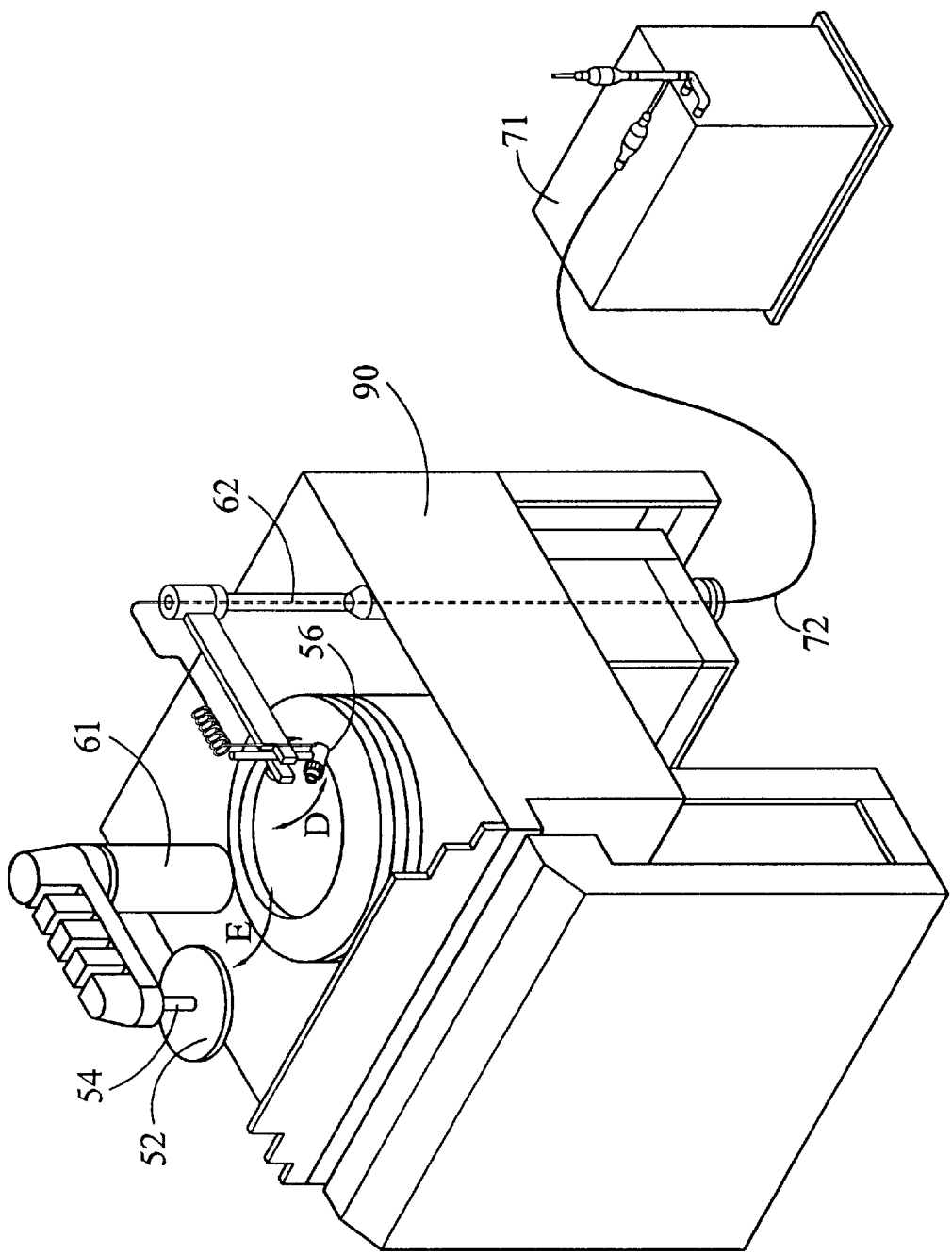
FIG. 3 is a schematic view depicting a first embodiment of an apparatus for cleaning wafers with contact holes or via holes as disclosed in the invention.
Figure 4:
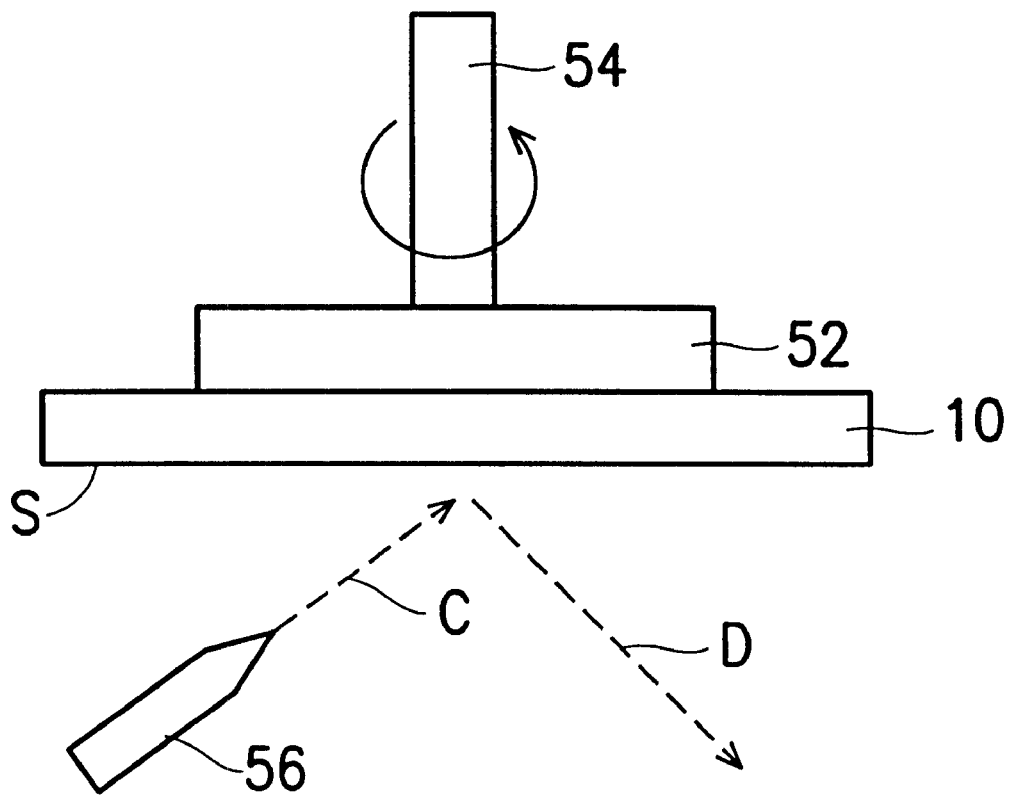
FIG. 4 is a schematic view depicting an inner portion of the apparatus as disclosed in the first embodiment.

In FIG. 3 and FIG. 4, a first embodiment of an apparatus 100 for cleaning wafers with contact holes or via holes as disclosed in the invention is shown. FIG. 3 is a schematic view depicting a first embodiment of an apparatus for cleaning wafers with contact holes or via holes as disclosed in the invention, and FIG. 4 is a schematic view depicting an inner portion of the apparatus as disclosed in the first embodiment.

Figure 1:
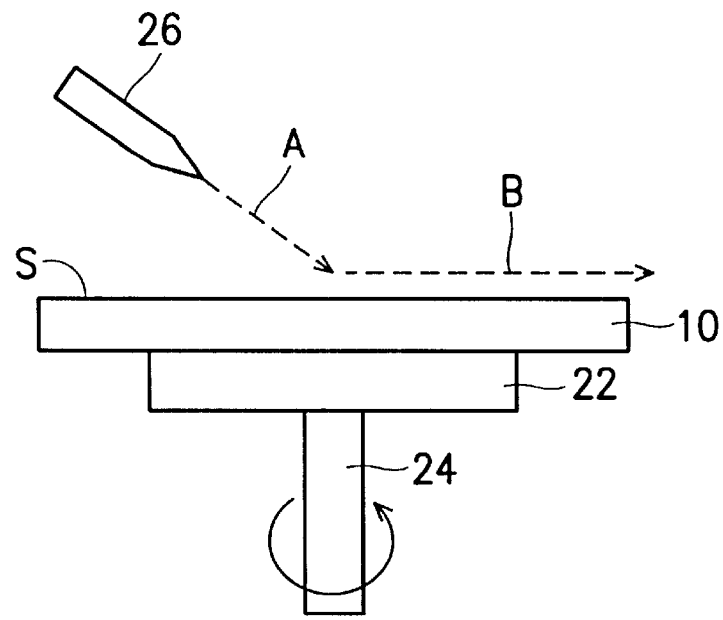
FIG. 1 is a schematic view depicting a traditional apparatus for cleaning wafers with contact holes or via holes.
Figure 2:
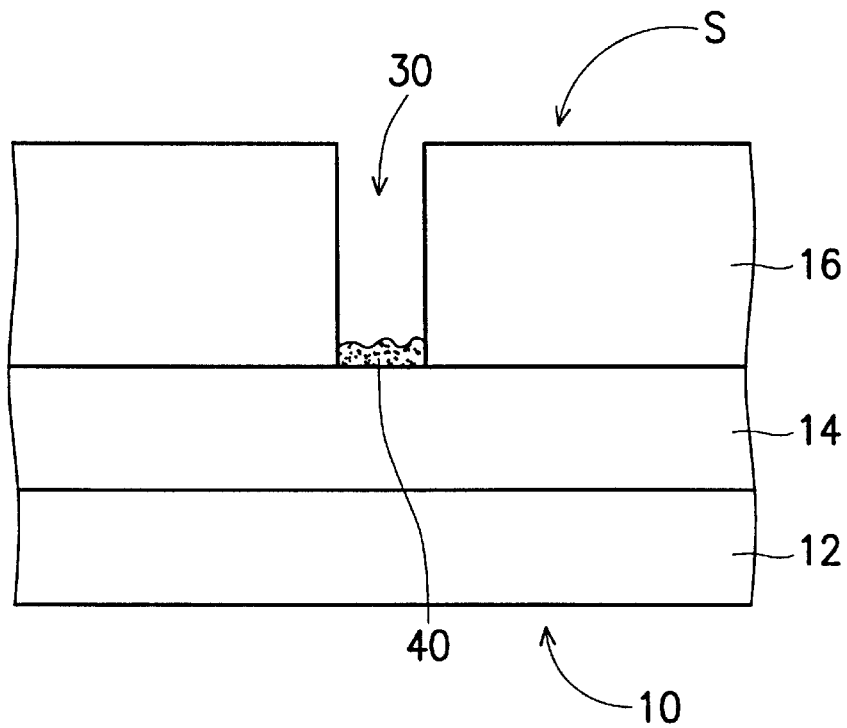
FIG. 2 is a cross-sectional view depicting the wafer with the via hole.

As shown in FIG. 3 and FIG. 4, numeral 90 represents a base. Parts of the apparatus 100 can be disposed inside the base 90. A first arm 61 and a second arm 62 are disposed inside the base 90. A fixing device 52 is disposed at the front end of the first arm 61, and may be a vacuum chuck. By means of vacuum, the fixing device 52 fixes the wafer 10, with a via hole 30 as shown in FIG. 2, in a manner such that a surface S, with the via hole 30, of the wafer 10 faces downward. A rotating device 54, disposed above the fixing device 52, connects to the fixing device 52 and rotates the fixing device 52.

A spraying device 56 is disposed at the front end of the second arm 62. In FIG. 3, the spraying device 56 is a sprayer.

With regard to the relative position, the spraying device 56 is beneath the fixing device 52. Thus, the water, sprayed from the spraying device 56, is sprayed upwards to the surface S, with the via hole 30, of the wafer 10. The spraying device 56 communicates with a water-supplying device 71 through a pipe 72. The water-supplying device supplies DI water.

It is noted that the cleaning of the wafer with contact holes is essentially the same as the cleaning of the wafer with via holes; therefore, its description is omitted.

As stated above, the deposition manner of the wafer 10 is that the surface S, with the via hole 30, of the wafer 10 faces downward. In addition, the spraying water sprays the surface S of the wafer 10 in a direction opposed to gravity. As a result, the spraying water advances in a direction as shown by arrow C and arrow D in FIG. 4. That is, after the water sprays the surface S of the wafer, it advances downward due to gravity. Thus, after the water sprays into the via hole 30, the water immediately exits the via hole 30 due to gravity. The water cannot easily remain in the via hole 30, thereby reducing the possibility of native oxide remaining in the contact hole or via hole. In addition, defects generated on the surface of the wafer are splashed up by the water immediately separating them from the wafer along with the water, due to gravity. Thus, the removal of defects from the surface of the wafer is greatly enhanced.

Second Embodiment

Figure 5:
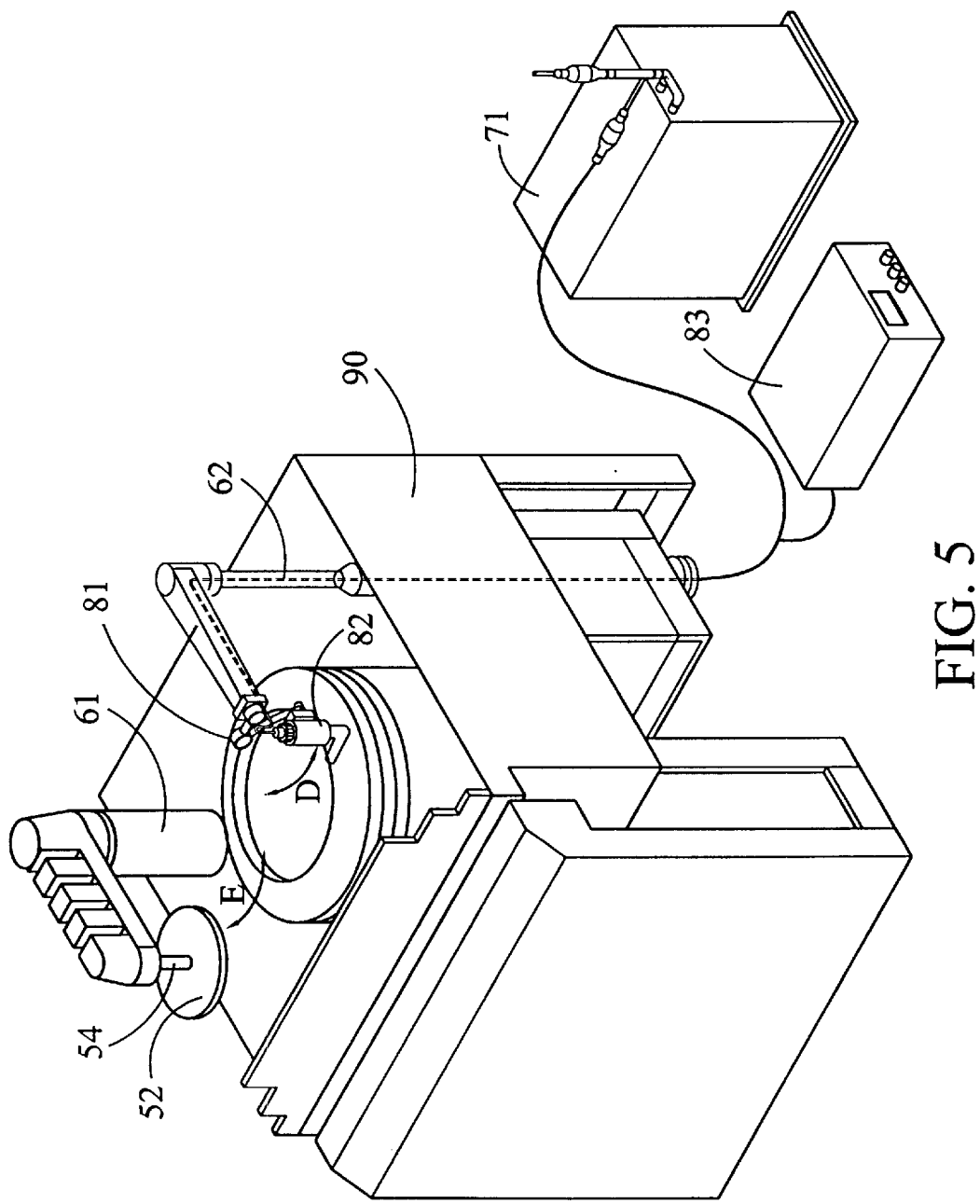
FIG. 5 is a schematic view depicting a second embodiment of an apparatus for cleaning wafers with contact holes or via holes as disclosed in the invention.

FIG. 5 is a schematic view depicting a second embodiment of an apparatus 200 for cleaning wafers with via holes or contact holes, as disclosed in the invention. In this embodiment, the apparatus 200 comprises a fixing device 52, a rotating device 54, a spraying device 56, a water-supplying device 71, a pipe 72, a first arm 61, a second arm 62 and a base 90. Since the structure and the disposition of the above parts are the same as the first embodiment, their description is omitted and their marks are the same as the first embodiment.

The difference between this embodiment and the first embodiment is that an oscillator 81, a nozzle 82 and a controller 83 are additionally disposed.

The controller 83 excites DI water molecules to provide ultrasonic cleaning when DI water is supplied to the wafer 10. The oscillator 81, disposed at the second arm 62, is used as an oscillation-transmitting device between the nozzle 82 and the controller 83. The nozzle 82, disposed at the second arm 62, is electrically connected to the controller 83 via the oscillator 81. The nozzle 82 replaces the spraying device of the first embodiment.

In the above structure, DI water, ejected from the nozzle 82, ultrasonically cleans the surface of the wafer 10. Since the other structure of this embodiment is the same as the first embodiment, after the water sprays into the via hole 30, the water immediately exits the via hole 30 due to gravity. Thus, the water cannot easily remain in the via hole 30, reducing the possibility of native oxide remaining in the contact or via holes. In addition, defects generated on the surface of the wafer are splashed up by the water, immediately departing from the wafer due to gravity. Thus, the removal of defects from the surface of the wafer is greatly enhanced.

While the invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereto.

What is claimed is:

1. An apparatus for cleaning wafers with contact holes via holes comprising:

a first arm and a second arm;

a fixing device, disposed on the first arm, for fixing the wafer in a manner such that a surface, with contact holes or via holes, of the wafer faces downward;

a rotating device, disposed above the fixing device, for rotating the fixing device; and a spraying device, disposed on the second arm in a manner such that the spraying device is located beneath the fixing device, for spraying the water upwards to the surface of the wafer.

2. The apparatus as claimed in claim 1, wherein the fixing device is a vacuum chuck.

3. The apparatus as claimed in claim 1 or 2, wherein the spraying device is a sprayer.

4. The apparatus as claimed in claim 1 or 2, wherein the spraying device is a nozzle.

5. The apparatus as claimed in claim 4, further comprising:

an oscillator, disposed on the second arm, communicating with the nozzle; and a controller electrically connected to the oscillator.

* * * * *